United States Patent [19]

Butler et al.

[11] Patent Number: 5,446,284
[45] Date of Patent: Aug. 29, 1995

[54] MONOLITHIC DETECTOR ARRAY APPARATUS

[75] Inventors: Neal R. Butler, Acton; Shigesato Iwasa, Harvard, both of Mass.

[73] Assignee: Loral Infrared & Imaging Systems, Inc., Lexington, Mass.

[21] Appl. No.: 186,653

[22] Filed: Jan. 25, 1994

[51] Int. Cl.6 .......................... G01J 5/20; H01L 31/09
[52] U.S. Cl. ................................ 250/332; 250/338.4; 250/370.08
[58] Field of Search ................... 250/338.3, 332, 338.4, 250/370.08, 349; 257/466, 465, 73, 54

[56] References Cited

U.S. PATENT DOCUMENTS

| | | |
|---|---|---|
| 3,626,188 | 12/1971 | Chilton . |
| 4,122,344 | 10/1978 | Lettington et al. . |
| 4,362,938 | 12/1982 | Bosserman . |
| 4,443,701 | 4/1984 | Bailey ..................... 250/370.08 X |
| 4,450,479 | 5/1984 | Horne . |
| 4,752,694 | 6/1988 | Hegel, Jr. et al. . |
| 4,754,139 | 6/1988 | Ennulat et al. . |
| 4,948,963 | 8/1990 | Ballingall ................ 250/338.4 X |
| 5,010,251 | 4/1991 | Grinberg et al. . |
| 5,070,246 | 12/1991 | Durham et al. . |
| 5,286,976 | 2/1994 | Cole .................................. 250/349 |
| 5,293,041 | 3/1994 | Kruse, Jr. .......................... 250/332 |
| 5,300,915 | 4/1994 | Higashi et al. ............. 250/338.4 X |

FOREIGN PATENT DOCUMENTS

| | | | |
|---|---|---|---|
| 3333410 | 4/1985 | Germany ............................ 257/466 |
| 56-1578 | 1/1981 | Japan ................................... 257/73 |
| 59-32828 | 2/1984 | Japan ............................. 250/338.3 |
| 57-200664 | 5/1984 | Japan ............................. 250/338.3 |
| 57-200665 | 5/1984 | Japan ............................. 250/338.3 |
| 59-28904 | 9/1985 | Japan ............................. 250/338.3 |
| 63-124923 | 5/1988 | Japan ............................. 250/338.3 |
| 64-3525 | 1/1989 | Japan ............................. 250/338.3 |
| 194227 | 4/1994 | Japan ............................. 250/338.3 |

OTHER PUBLICATIONS

Japanese Abstract 57. 104380 Jun. 1982.

*Primary Examiner*—Constantine Hannaher
*Assistant Examiner*—Edward J. Glick
*Attorney, Agent, or Firm*—Leone & Moffa

[57] ABSTRACT

A monolithic detector array apparatus for sensing infrared radiation. An array of semiconductor diode bolometers are fabricated on micromachined thermal isolation structures called microbridges. The detectors are configured in an array and addressed by row and column. Readout circuitry may be optionally incorporated onto a common substrate. The monolithic detector array may be highly integrated, resulting in a low cost and a high performance focal plane array.

16 Claims, 3 Drawing Sheets

MONOLITHIC DETECTOR ARRAY APPARATUS

This invention relates to a monolithic detector array apparatus and more particularly to a monolithic detector array apparatus for detecting and imaging radiation in the infrared region of the electromagnetic spectrum using an array of semiconductor diode bolometers which have been fabricated on micromachined, thermally isolated structures.

BACKGROUND OF THE INVENTION

Prior art infrared detectors are thermal detectors; they operate by absorbing incident electromagnetic radiation which is usually in the infrared region, centered around ten micrometers wavelength. Thermal detectors are sensitive to all wavelengths of radiation and are sometimes used to detect other wavelengths. A thermal radiation detector functions by absorbing incident radiation and converting the incident radiation to heat. The resulting temperature rise of the detector is then converted to an electrical signal. Any measurable temperature dependent material property may be used to sense the temperature.

The prior art has fabricated solid state infrared detector arrays which operate at room temperature, including pyroelectric and ferroelectric hybrid structures and monolithic bolometer arrays. The hybrid pyroelectric and ferroelectric arrays are fabricated in two parts, one part containing the infrared detector array, and the other part containing electronic circuitry to condition the detector signals and present them sequentially to a single output, forming a video signal. The monolithic bolometer array incorporates an array of bolometer detectors fabricated on micromachined thermal isolation structures called microbridges; the readout electronic circuitry is located on the microbridge substrate. This monolithic structure, in contrast to the hybrid arrays, may be fabricated using only thin film deposition and etching techniques.

SUMMARY OF THE INVENTION

The invention provides an array of silicon diode bolometers, fabricated on micromachined thermal isolation structures known as microbridges. Each silicon diode bolometer is fabricated over a silicon substrate at a predetermined distance from the substrate. The dimensions of the silicon diode bolometers are precisely controlled to achieve desired electrical characteristics. The array of detectors are positioned such that they may be easily scanned using a column and row addressing technique.

A unique feature of this invention is that the detectors also form an essential part of the electronic readout circuitry. The detector diodes are connected in a row and column manner, with the anode of each connected to a corresponding row address line, and the cathode to a corresponding column address line.

It is one object of the invention to provide a highly integrated, high performance, low cost, infrared radiation sensitive focal plane array.

It is a further object of the invention to allow the placement of additional readout circuitry on the substrate material, which is typically a semiconductor such as silicon.

Other objects, features and advantages of the present invention will become apparent to those skilled in the art through the description of the preferred embodiment, claims and drawings herein where like numerals refer to like elements.

DETAILED DESCRIPTION OF THE PREFERRED EMBODIMENT

This invention uses the temperature dependence of the forward biased voltage drop of a semiconductor diode. This detector is called a diode bolometer because it is similar in some ways to a resistive bolometer detector, which uses the temperature coefficient of resistance of a material as the temperature sensitive property.

Figure 1:
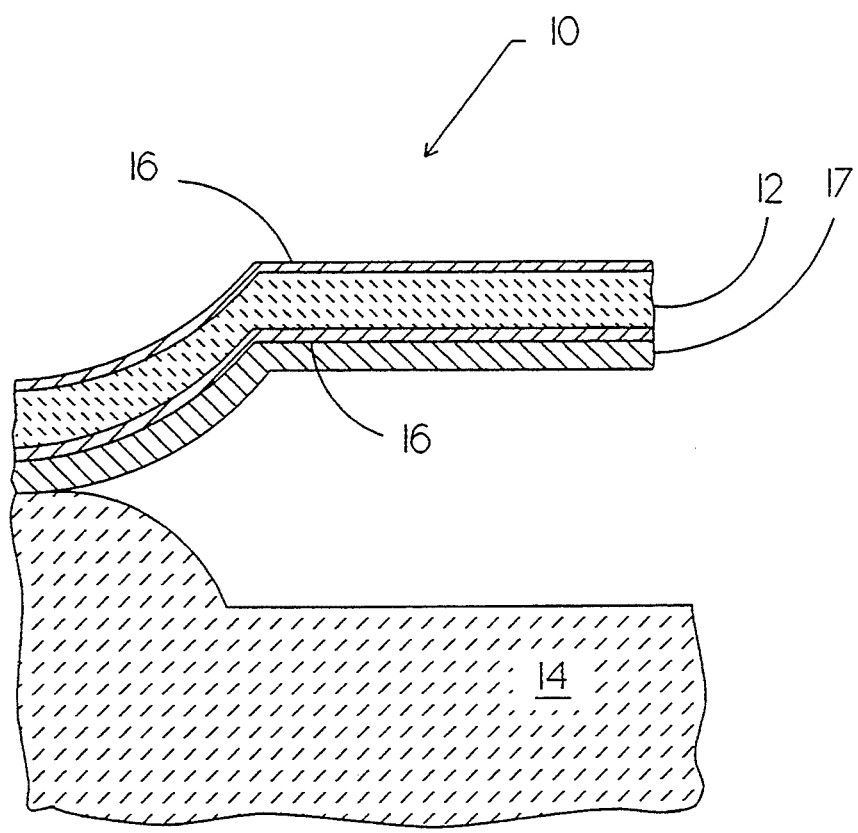
FIG. 1 shows a cross section of a single detector in the array, showing the microbridge structure.

FIG. 1 shows the physical structure of a microbridge detector. The physical structure incorporates an active detector element 10. The detector element 10 is shown supported by a micromachined cantilever 12 comprised substantially of polysilicon. A space is formed below the microbridge by etching a pit beneath the microbridge structure. In one preferred embodiment of the invention, the microbridge structure is positioned about ¼ wavelength or about 2.5 micrometers above the substrate material 14; this construction provides for enhanced absorption of infrared radiation of 10 micrometer wavelength.

The microbridge structure itself consists of a number of layers, each providing a specific function. The polysilicon detector material is encapsulated above and below by a passivation layer 16, typically silicon nitride. Also included is a thin metal layer 17, typically chrome, which provides electrical connection to the detector and also serves to absorb the infrared radiation.

The detector element 10 comprises a structure which may be made with standard silicon processing; no material or processing is required other than those normally used in the fabrication of silicon integrated circuits, particularly silicon gate CMOS circuits. However, the resultant structure has not been known prior to the instant invention.

The monolithic micromachined structure of the invention is capable of giving the highest theoretical sensitivity of any known structure of this size: a $D^*$ figure value in excess of about $1 \times 10^9$ is theoretically obtainable with a structure of the present invention. The limiting sensitivity of the detector is given by the well-known thermal fluctuation limit:

$$NEP = (4kGt^2)^{\frac{1}{2}}$$

where NEP is the detector noise equivalent power, G is the thermal conductance of the detector to its surroundings, T is the absolute temperature, and k is Boltzman's constant. Typical values of G obtained with microbridge structures are generally in the range of $10^{-7} W/°K.$, with a corresponding NEP of about $7 \times 10^{-13} W/Hz^{\frac{1}{2}}$ and a limiting $D^*$ of about $3.5 \times 10^9$ for a 25 micrometer square element. An array of elements with such a $D^*$ figure value is capable of detecting temperature changes in an image of about 0.01 degrees Celsius using a standard F/1 infrared optical system.

A unique feature of this invention is the use of the detectors as part of the readout or multiplexing apparatus for the focal plane array. It is well known that the temperature coefficient of the forward voltage drop of a semiconductor diode is approximately $-2.5$ mV/°K., independent of the constituents of the diode material and fabrication, and of the diode operating current. With a nominal forward voltage drop of 0.5 Volts, this corresponds to a change in detector voltage of one half of one percent per degree Kelvin (0.5%/°K.), which is substantially larger than that of a classical metal bolometer, typically about 0.3%/°K.

Figure 2:
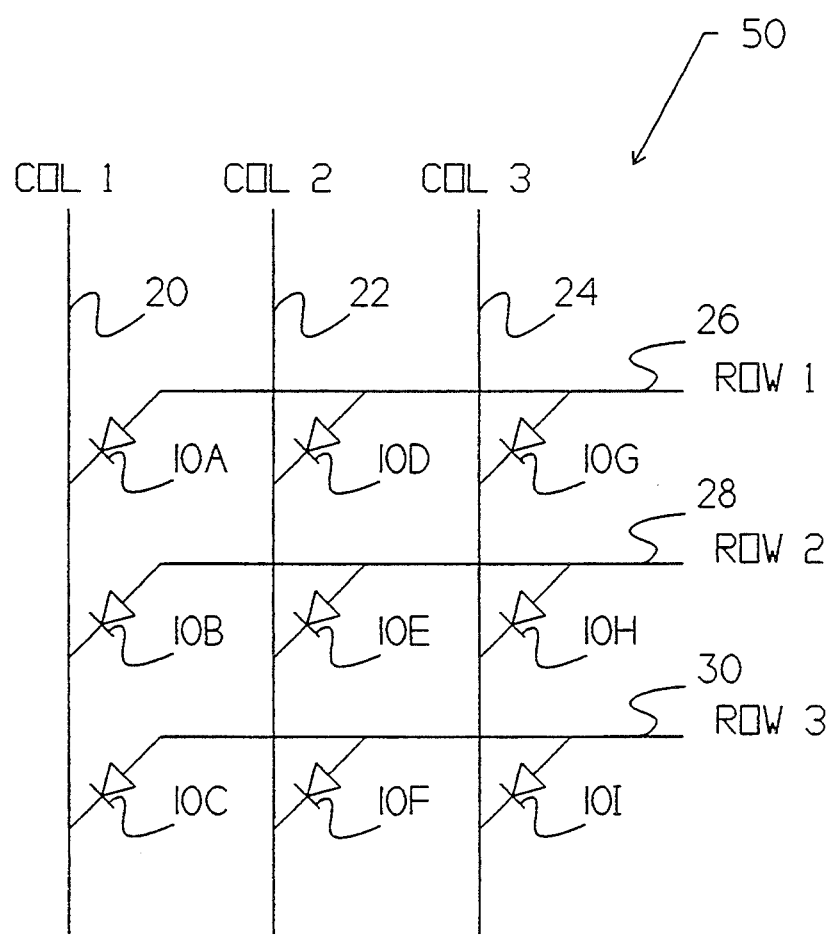
FIG. 2 is an electrical schematic of a small portion of an array, illustrating the row and column addressing scheme.

FIG. 2 shows an electrical schematic of a 3×3 array of diodes constructed in accordance with the teachings of the present invention. In one embodiment of the invention the imaging array may have 240×330 or more elements. The column lines 1, 2 and 3, as designated by reference characters 20, 22, and 24, respectively, are connected to the cathodes of the diodes 10A-10I in columns 1, 2 and 3, respectively. In a similar way, the anodes of diodes in the rows 1, 2, and 3 are respectively connected to the row lines 26, 28, and 30. To read the forward voltage drop of diode 10A, for example, a known current is applied to row line 1, while column line 1 is set to a negative voltage which is approximately equal in magnitude to the forward voltage drop of a diode. Column lines 2 and 3 are connected to zero volts. The voltage on row line 1 is near zero, and the voltage across diodes 10D and 10G is approximately zero. Therefore, practically all the current flowing into row line 1 flows through diode 10A as desired, and the voltage of the row line 1 is the forward voltage drop.

Diodes 10B and 10C may be biased at the same time as diode 10A by applying current to row lines 2 and 3 and monitoring the voltages on the same lines. In general, any or all of the diodes on either a row or column line may be accessed simultaneously by similar methods for any size of array. All of the other diodes have nearly zero volts applied, where they conduct very little current, and thus do not affect the operation of the array.

The signal to noise ratio of the invention is independent of the time taken to access each detector, and depends only on the temperature rise of the element. In contrast to the prior art, the individual diodes in the array need not ever be reverse biased. Therefore, the reverse leakage current of diodes, which is generally a source of excess noise, is not generated.

Figure 3:
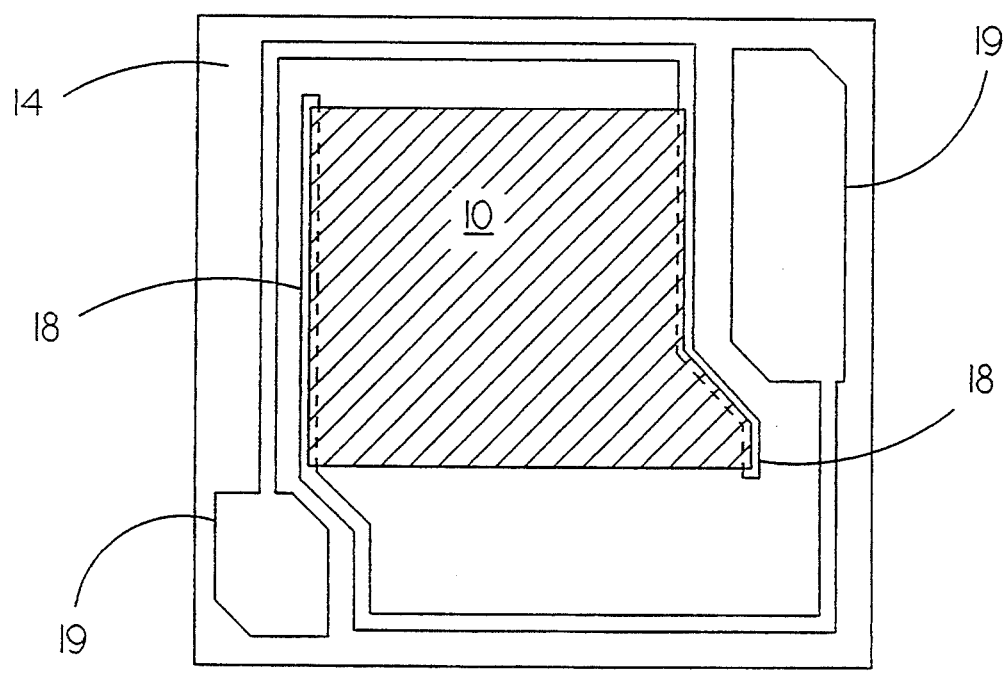
FIG. 3 shows schematically a top view of a single detector of an example embodiment of the array.

FIG. 3 shows a top view of a single detector of an example embodiment of the array. In this example embodiment, the invention has a passive substrate material 14. The passive substrate material may comprise silicon, gallium arsenide or germanium. Legs 18 form a microbridge structure above the passive substrate material at a contact location 19. The legs 18 support a detector element 10, which in this example embodiment comprises a silicon diode, positioned at least 2.0 micrometers above the passive substrate material 14. The detector element 10 comprises a polysilicon detector material 12, a passivation layer 16 encapsulating the polysilicon detector material 12, and a thin metal layer 17, as best shown in FIG. 1. The thin metal layer 17 provides an electrical connection and a support to the detector 10 and the contact location 19. In one embodiment, the diode may be less than 1 millimeter thick and may advantageously be about 0.5 micrometers thick.

The invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. An electromagnetic radiation detector comprising:
   (a) a substrate having a top surface and a bottom surface; and
   (b) a microbridge suspended over the top surface, the microbridge including a diode means for detecting electromagnetic radiation wherein a space is formed below the microbridge by etching a pit beneath the microbridge.

2. The apparatus of claim 1 wherein the substrate comprises a material selected from the group consisting of silicon, gallium arsenide and germanium.

3. The apparatus of claim 1 wherein the substrate is separated from the microbridge by at least two micrometers.

4. The apparatus of claim 1 wherein the diode means is about 0.5 micrometers thick.

5. The apparatus of claim 1 wherein the diode means further comprises a micromachined diode.

6. The apparatus of claim 1 wherein the microbridge comprises a polysilicon microbridge.

7. The apparatus of claim 1 wherein the diode means comprises a polysilicon diode.

8. The apparatus of claim 1 wherein the substrate comprises a silicon substrate.

9. A monolithic detector focal plane array for detecting infrared radiation comprising:
   (a) a silicon substrate having a top surface and a bottom surface; and
   (b) a plurality of polysilicon microbridges where each polysilicon microbridge is positioned at one end in contact with the silicon substrate and at another end suspended freely above the silicon substrate forming a polysilicon diode.

10. The apparatus of claim 9 wherein the silicon substrate is separated from the plurality of polysilicon microbridges by at least two micrometers.

11. The apparatus of claim 9 wherein the polysilicon diode is less than 1 millimeter thick.

12. The apparatus of claim 9 wherein the polysilicon diode is micromachined above the silicon substrate top surface and thermally isolated.

13. The apparatus of claim 9 wherein a space is formed below the polysilicon diode by etching a pit beneath the polysilicon microbridges.

14. The apparatus of claim 10 wherein the polysilicon diode further comprises a micromachined diode.

15. The apparatus of claim 9 wherein each of the plurality of polysilicon diodes may be accessed individually along either a row or a column.

16. The apparatus of claim 9 wherein each of the plurality of polysilicon diodes may be accessed in groups along either a row or a column.

* * * * *

UNITED STATES PATENT AND TRADEMARK OFFICE
CERTIFICATE OF CORRECTION

PATENT NO.    : 5,446,284
DATED         : August 29, 1995
INVENTOR(S)   : Neal R. Butler et al.

It is certified that error appears in the above-identified patent and that said Letters Patent is hereby corrected as shown below:

Column 4, line 57, delete number "10" and replace it with -- 9 --.

Signed and Sealed this

Twenty-sixth Day of March, 1996

Attest:

BRUCE LEHMAN

*Attesting Officer*        Commissioner of Patents and Trademarks